(12) United States Patent
Matsushita et al.

(10) Patent No.: US 12,027,324 B2
(45) Date of Patent: Jul. 2, 2024

(54) SOLAR CELL

(71) Applicant: Panasonic Intellectual Property Management Co., Ltd., Osaka (JP)

(72) Inventors: Akio Matsushita, Osaka (JP); Taisuke Matsui, Osaka (JP); Kenji Kawano, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/935,614

(22) Filed: Sep. 27, 2022

(65) Prior Publication Data

US 2023/0022255 A1    Jan. 26, 2023

Related U.S. Application Data

(63) Continuation of application No. PCT/JP2021/016251, filed on Apr. 22, 2021.

(30) Foreign Application Priority Data

Apr. 27, 2020 (JP) ................... 2020-078532

(51) Int. Cl.
*H01G 9/20* (2006.01)
*H10K 30/30* (2023.01)
(Continued)

(52) U.S. Cl.
CPC ............... *H01G 9/20* (2013.01); *H10K 30/30* (2023.02); *H10K 30/57* (2023.02); *H10K 39/601* (2023.02);
(Continued)

(58) Field of Classification Search
CPC .......... H01G 9/20; H10K 30/30; H10K 30/57; H10K 39/601; H10K 85/1135;
(Continued)

(56) References Cited

U.S. PATENT DOCUMENTS

2018/0174761 A1    6/2018   Kamino et al.

FOREIGN PATENT DOCUMENTS

JP    2016-178204    10/2016
JP    2018-518845    7/2018

OTHER PUBLICATIONS

Ramirez et al. "Interface Molecular Engineering for Laminated Monolithic Perovskite/Silicon Tandem Solar Cells with 80.4% Fill Factor", Adv. Funct. Mater. 2019, 29, 1901476 (Year: 2019).*

(Continued)

*Primary Examiner* — Angelo Trivisonno
(74) *Attorney, Agent, or Firm* — GREENBLUM & BERNSTEIN, P.L.C.

(57) ABSTRACT

A solar cell includes a first substrate, a first hole transport layer, a first photoelectric conversion layer containing a perovskite compound, and a second photoelectric conversion layer containing a photoelectric conversion material in this order. A band gap of the perovskite compound is greater than a band gap of the photoelectric conversion material. With respect to an absorption wavelength of the first photoelectric conversion layer 3, a refractive index $n_A$ of the first hole transport layer 2 satisfies refractive index of the first substrate$\leq n_A \leq$refractive index of the first photoelectric conversion layer. Further, with respect to a transmission wavelength of the first photoelectric conversion layer 3 and an absorption wavelength of the second photoelectric conversion layer 5, a refractive index $n_B$ of the first hole transport layer 2 satisfies refractive index of the first substrate$\leq n_B \leq$refractive index of the first photoelectric conversion layer.

18 Claims, 9 Drawing Sheets

(51) Int. Cl.
  *H10K 30/57*    (2023.01)
  *H10K 39/00*    (2023.01)
  *H10K 85/10*    (2023.01)
  *H10K 102/00*   (2023.01)
(52) U.S. Cl.
  CPC ....... *H10K 85/1135* (2023.02); *H10K 85/141* (2023.02); *H10K 2102/00* (2023.02)
(58) Field of Classification Search
  CPC ............. H10K 85/141; H10K 2102/00; H10K 30/40; H10K 30/86; H10K 85/50; H10K 2101/00; Y02B 10/10; Y02E 10/549
  See application file for complete search history.

(56) References Cited

OTHER PUBLICATIONS

Kanwat, "Vertical phase separation of PSS in organic photovoltaics with a nickel oxide doped PEDOT:PSS interlayer", Solar Energy Materials & Solar Cells 132 (2015) 623-631 (Year: 2015).*
International Search Report of PCT application No. PCT/JP2021/016251 dated Jul. 20, 2021.
Julian Burschka et al., "Sequential deposition as a route to high-performance perovskite-sensitized solar cells", Nature, vol. 499, Jul. 18, 2013, pp. 316-319.
Renxing Lin et al., "Monolithic all-perovskite tandem solar cells with 24.8% efficiency exploiting comproportionation to suppress Sn(ii) oxidation in precursor ink", Nature Energy, vol. 4, 2019, pp. 864-873.
Cesar Omar Ramirez Quiroz et al., "Interface Molecular Engineering for Laminated Monolithic Perovskite/Silicon Tandem Solar Cells with 80.4% Fill Factor", Advanced Functional Materials, Aug. 7, 2019, vol. 29, pp. 1901476-1-1901476-13.
Anil Kanwat et al., "Vertical phase separation of PSS in organic photovoltaics with a nickel oxide doped PEDOT:PSS interlayer", Solar Energy Materials & Solar Cells, Nov. 7, 2014, vol. 132, pp. 623-631.
Anil Kanwat et al., "Improved power conversion efficiency of perovskite solar cells using highly conductive WOx doped PEDOT:PSS", New Journal of Chemistry, Oct. 7, 2018, vol. 42, No. 19, pp. 16075-16082.
The EPC Office Action dated Sep. 20, 2023 for the related European Patent Application No. 21797158.9.
Hammer DX et al: "Spectrally resolved white-light interferometry for measurement of ocular dispersion", Journal of the Optical Society of America. A, Optics, image science, and vision, Sep. 1, 1999 (Sep. 1, 1999), pp. 2092-2102, XP093079598.
Rudi Santbergen et al: "Minimizing optical losses in monolithic perovskite/c-Si tandem solar cells with a flat top cell", Optics Express, vol. 24, No. 18, Aug. 26, 2016 (Aug. 26, 2016), p. A1288, XP055693517.
Loper Philipp et al: "Complex Refractive Index Spectra of CH 3 NH 3 PbI 3 Perovskite Thin Films Determined by Spectroscopic Ellipsometry and Spectrophotometry", Journal of Physical Chemistry Letters, vol. 6, No. 1, Dec. 15, 2014 (Dec. 15, 2014), pp. 66-71, XP093079593.
Grant D. T. et al: "Design guidelines for perovskite/silicon 2-terminal tandem solar cells: an optical study", Optics Express, vol. 24, No. 22, Oct. 7, 2016 (Oct. 7, 2016), XP093079596.
Venter Andre et al: "Optical and electrical properties of NiO for possible dielectric applications", South African Journal of Science, Jan. 26, 2011 (Jan. 26, 2011), XP093079595.
Yinhua Zhou et al: "Direct correlation between work function of indium-tin-oxide electrodes and solar cell performance influenced by ultraviolet irradiation and air exposure", Physical Chemistry Chemical Physics, vol. 14, No. 34, Jan. 1, 2012 (Jan. 1, 2012), p. 12014, XP055167786.

* cited by examiner

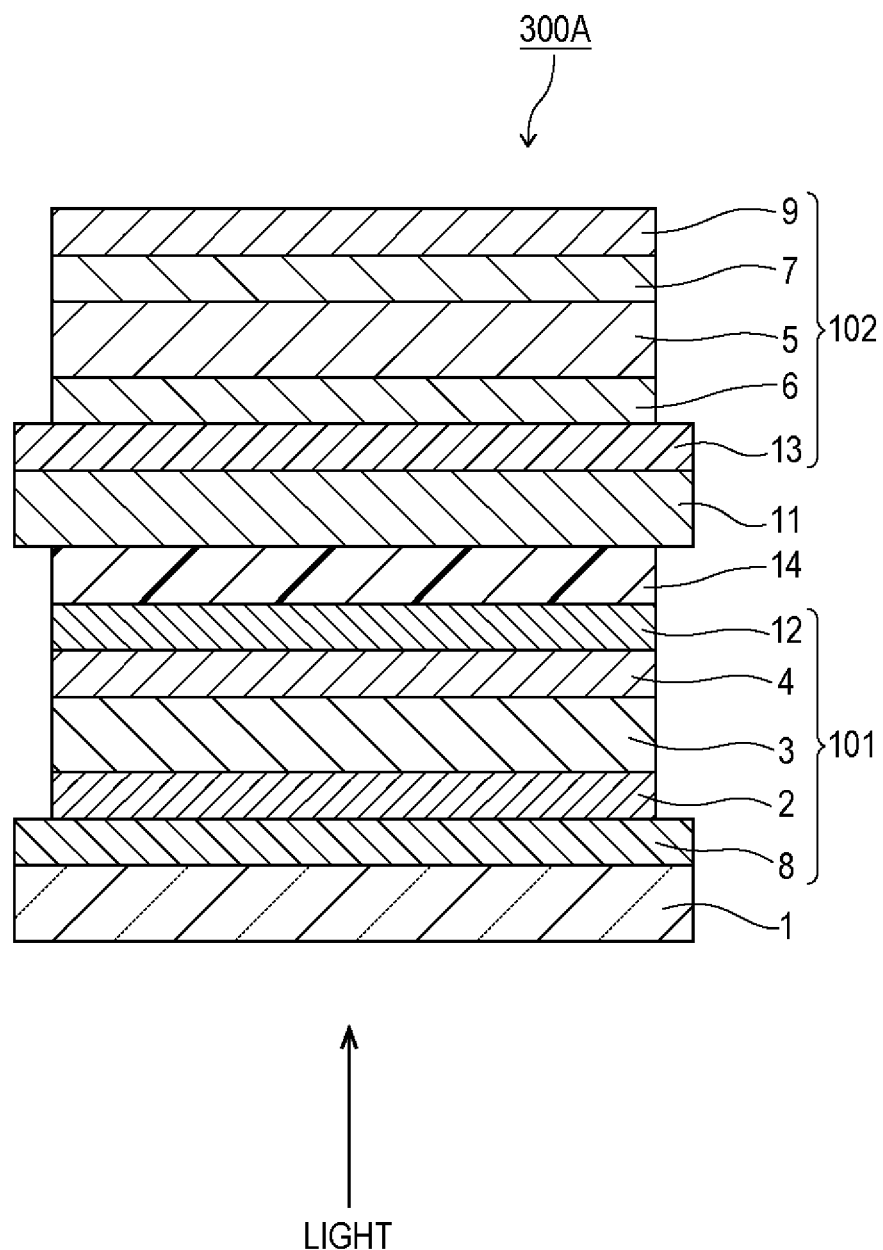

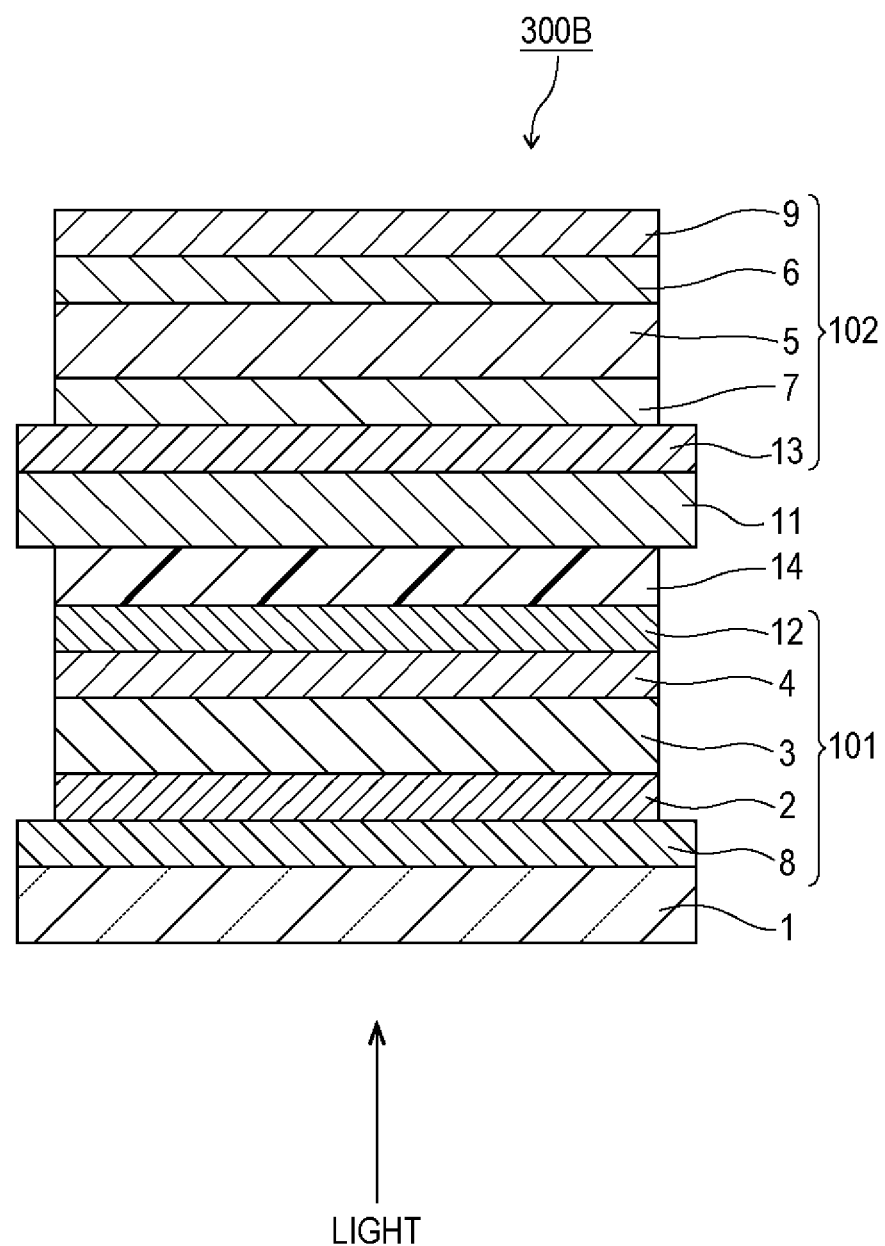

LIGHT

SOLAR CELL

BACKGROUND

1. Technical Field

The present invention relates to a solar cell.

2. Description of the Related Art

In recent years, perovskite solar cells have been researched and developed as new solar cells.

With respect to perovskite solar cells, perovskite compounds denoted by a chemical formula $ABX_3$ (herein, A represents a monovalent cation, B represents a divalent cation, and X represents a halogen anion) are used as photoelectric conversion materials.

Julian Burschka et al., "Sequential deposition as a route to high-performance perovskite-sensitized solar cells", Nature, vol. 499, pp. 316-319, 18 Jul. 2013 discloses a perovskite solar cell in which a perovskite compound denoted by a chemical formula $CH_3NH_3PbI_3$ (hereafter referred to as "$MAPbI_3$") is used as a photoelectric conversion material of a perovskite solar cell. In the perovskite solar cell disclosed in Julian Burschka et al., the perovskite compound denoted by $MAPbI_3$, $TiO_2$, and Spiro-OMeTAD are used as a photoelectric conversion material, an electron transport material, and a hole transport material, respectively.

Renxing Lin, et al., "Monolithic all-perovskite tandem solar cells with 24.8% efficiency exploiting comproportionation to suppress Sn(ii) oxidation in precursor ink", Nature Energy, vol. 4, pp. 864-873, 2019 discloses a perovskite tandem solar cell. The perovskite tandem solar cell has a configuration in which a plurality of solar cells including respective perovskite compounds having band gaps that differ from each other are stacked on one another. The perovskite tandem solar cell can improve a photoelectric conversion efficiency.

SUMMARY

One non-limiting and exemplary embodiment provides a perovskite tandem solar cell having a high photoelectric conversion efficiency.

In one general aspect, the techniques disclosed here feature a solar cell including a first substrate, a first hole transport layer, a first photoelectric conversion layer, and a second photoelectric conversion layer in this order, wherein the first hole transport layer contains a p-type metal oxide semiconductor and a p-type organic semiconductor polymer, the first photoelectric conversion layer contains a perovskite compound, the second photoelectric conversion layer contains a photoelectric conversion material, a band gap of the perovskite compound is greater than a band gap of the photoelectric conversion material, with respect to an absorption wavelength of the first photoelectric conversion layer, a refractive index $n_A$ of the first hole transport layer satisfies Relational expression (1) below, refractive index of the first substrate≤$n_A$≤refractive index of the first photoelectric conversion layer     Relational expression (1):

and with respect to a transmission wavelength of the first photoelectric conversion layer and an absorption wavelength of the second photoelectric conversion layer, a refractive index $n_B$ of the first hole transport layer satisfies Relational expression (2) below, refractive index of the first substrate≤$n_B$≤refractive index of the first photoelectric conversion layer     Relational expression (2):

It is an object of the present disclosure to provide a perovskite tandem solar cell having a high photoelectric conversion efficiency.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 3A is a schematic sectional view illustrating a perovskite tandem solar cell according to a third embodiment;

FIG. 3B is a schematic sectional view illustrating a modified example of the perovskite tandem solar cell according to the third embodiment;

DETAILED DESCRIPTIONS

Definition of Term

Figure 1:
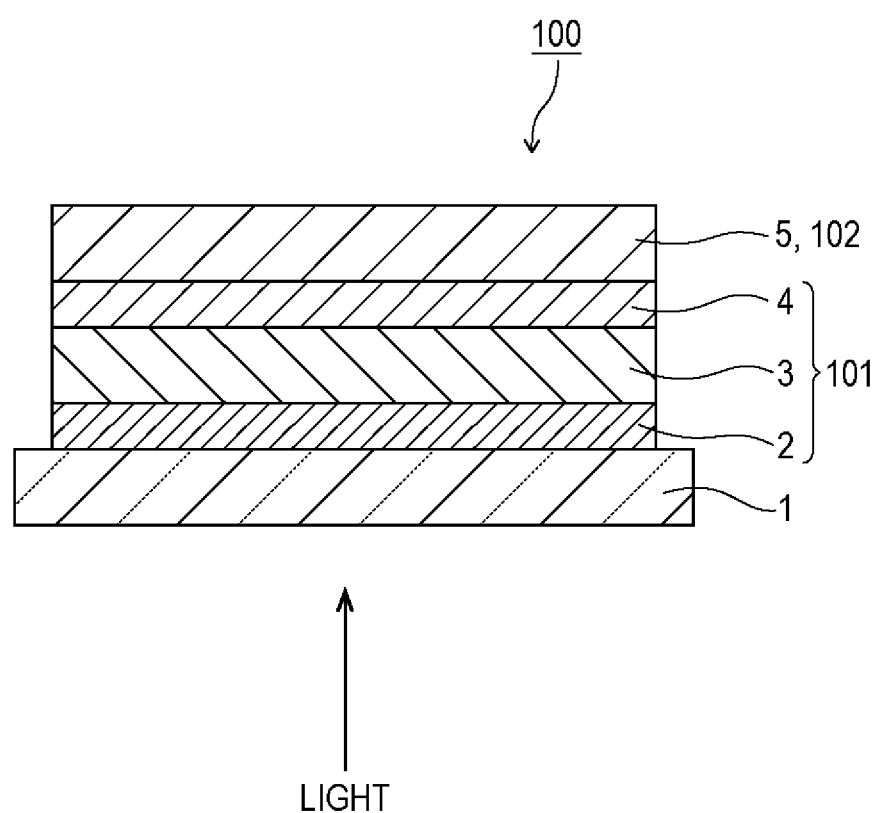
FIG. 1 is a schematic sectional view illustrating a perovskite tandem solar cell according to a first embodiment.

A term "perovskite compound" used in the present specification means a perovskite crystal structure denoted by a chemical formula $ABX_3$ (herein, A represents a monovalent cation, B represents a divalent cation, and X represents a halogen anion) and a structure having a crystal similar to the perovskite crystal.

A term "perovskite solar cell" used in the present specification means a solar cell containing a perovskite compound as a photoelectric conversion material.

A term "tandem solar cell" used in the present specification means a stacked solar cell having a configuration in which a plurality of solar cells including respective photoelectric conversion materials having band gaps that differ from each other are stacked on one another.

A term "perovskite tandem solar cell" used in the present specification means a tandem solar cell in which a photoelectric conversion material used for at least one solar cell constituting the tandem solar cell is a perovskite compound.

Underlying Knowledge Forming Basis of the Present Disclosure

Underlying knowledge forming basis of the present disclosure will be described below.

In general, the tandem solar cell has a structure in which a solar cell including a photoelectric conversion material having a wide band gap (hereafter referred to as "top cell") and a solar cell including a photoelectric conversion material having a narrow band gap (bottom cell) are stacked. In the tandem solar cell, in general, the solar cell including a photoelectric conversion material having a wide band gap is disposed on the light incident side and is called a "top cell". In general, the solar cell including a photoelectric conversion material having a narrow band gap is disposed on the opposite side of the light incident side and is called a "bottom cell". The solar cells including respective photoelectric conversion materials having band gaps that differ from each other being stacked enables the light, of the incident light, with a wavelength unable to be absorbed in the top cell to be absorbed in the bottom cell so as to generate electricity. Consequently, the light in a wide band can be used compared with the solar cell including a single photoelectric conversion material, and the conversion efficiency of the solar cell can be improved.

When perovskite solar cells are stacked on one another and are used as a tandem solar cell, as disclosed in NPL 2, in a common structure, the bottom cell is stacked, with a recombination layer interposed therebetween, on the top cell in which the first electrode, the hole transport layer, the photoelectric conversion layer, and the electron transport layer are arranged in this order from the substrate side.

In such an instance, in general, a p-type metal oxide semiconductor or a p-type organic semiconductor polymer is used for the hole transport layer in the top cell. When the p-type metal oxide semiconductor is used, it is difficult to use the coating process akin to that for the perovskite material since, in general, the p-type metal oxide semiconductor is produced using a vacuum process. To realize the coating process, examples of the method include a method in which the p-type metal oxide semiconductor is made into nanoparticles, and a solution including the dispersed nanoparticles is applied. However, a film produced by using such a method has high resistance and is not suitable for a solar cell. In addition, the refractive index of the p-type metal oxide semiconductor in a long-wavelength region is greater than the refractive indices of the first electrode material and the perovskite material. This causes an increase in light reflection in the long-wavelength region at the interface between the hole transport layer and a layer located upstream in the moving direction of the incident light and at the interface between the hole transport layer and a layer located downstream. Consequently, the amount of the long-wavelength light passing through the top cell is decreased, and the efficiency of the bottom cell is decreased. In this regard, in the above-described common configuration described in, for example, NPL 2, a layer that adjoins the hole transport layer and that is located upstream of the hole transport layer in the moving direction of the incident light is the first electrode or the substrate when the substrate also serves as the first electrode. In this regard, a layer that adjoins the hole transport layer and that is located downstream of the hole transport layer in the moving direction of the incident light is the photoelectric conversion layer.

On the other hand, when the p-type organic semiconductor polymer is used, film formation can be readily performed using the coating process. However, the refractive index of the p-type organic semiconductor polymer is significantly lower than the refractive indices of the first electrode material and the perovskite material. This causes an increase in light reflection at the interface between the hole transport layer and a layer located upstream in the moving direction of the incident light and at the interface between the hole transport layer and a layer located downstream. Consequently, reflection is increased at the interfaces between the hole transport layer and the respective adjacent layers, and the efficiency of the solar cell is suppressed from increasing.

In consideration of these findings, the present inventors found that a low-resistance film can be realized by the coating process and that a high conversion efficiency can be realized in a tandem solar cell by realizing a hole transport layer material, in the top cell, having the refractive indices at a long wavelength and a short wavelength positioned between those of the perovskite material and the first electrode material.

The embodiments according to the present disclosure will be described below in detail with reference to the drawings.

EMBODIMENTS ACCORDING TO THE PRESENT DISCLOSURE

First Embodiment

FIG. 1 is a schematic sectional view illustrating a perovskite tandem solar cell according to a first embodiment. As illustrated in FIG. 1, the perovskite tandem solar cell 100 according to the first embodiment includes a top cell 101 and a bottom cell 102 on a first substrate 1.

The top cell 101 includes a first hole transport layer 2, a first photoelectric conversion layer 3, and a first electron transport layer 4. The bottom cell 102 includes a second photoelectric conversion layer 5. The solar cell 100 according to the first embodiment includes the first substrate 1, the first hole transport layer 2, first photoelectric conversion layer 3, the first electron transport layer 4, and the second photoelectric conversion layer 5 successively from the light-incident surface, that is, successively from the bottom in FIG. 1. In other words, the solar cell 100 according to the first embodiment satisfies conditions (1) to (3) below. It is desirable that the condition (3) be satisfied, however, the condition (3) is not limited to being satisfied.

(1) The first photoelectric conversion layer 3 is disposed between the first substrate 1 and the second photoelectric conversion layer 5.

(2) The first hole transport layer 2 is disposed between the first substrate 1 and the first photoelectric conversion layer 3.

(3) The first electron transport layer 4 is disposed between the first photoelectric conversion layer 3 and the second photoelectric conversion layer 5.

The top cell 101 is not limited to including the first electron transport layer 4. That is, the solar cell 100 according to the first embodiment may include the first substrate 1, the first hole transport layer 2, first photoelectric conversion layer, and the second photoelectric conversion layer in this order.

In this regard, between the above-described various types of layers constituting the solar cell 100 according to the first embodiment, other layers may be appropriately disposed for suppressing the various types of layers from recombining at the interface or for bonding the various types of layers to each other.

The first photoelectric conversion layer 3 contains a perovskite compound. The second photoelectric conversion layer 5 contains a photoelectric conversion material. In such an instance, the band gap of the perovskite compound is greater than the band gap of the photoelectric conversion material contained in the second photoelectric conversion layer 5. According to the present configuration, the short-wavelength light is absorbed in the first photoelectric conversion layer 3. Herein, the short-wavelength light is light with a wavelength of, for example, 300 nm to 700 nm. In this regard, the long-wavelength light is absorbed in the second photoelectric conversion layer 5. Herein, the long-wavelength light is light with a wavelength of, for example, 700 nm to 1,200 nm. Having such a configuration enables the solar cell 100 to efficiently absorb the light.

With respect to an absorption wavelength of the first photoelectric conversion layer 3, the refractive index $n_A$ of the first hole transport layer 2 satisfies Relational expression (1) below.

refractive index of the first substrate $1 \leq n_A \leq$ refractive
index of the first photoelectric conversion layer
3                   Relational expression (1):

Further, with respect to a transmission wavelength of the first photoelectric conversion layer 3 and an absorption wavelength of the second photoelectric conversion layer 5, the refractive index $n_B$ of the first hole transport layer 2 satisfies Relational expression (2) below.

refractive index of the first substrate $1 \leq n_B \leq$ refractive
index of the first photoelectric conversion layer
3                   Relational expression (2):

The first hole transport layer 2 satisfying Relational expressions (1) and (2) above enables the solar cell 100 according to the first embodiment to effectively exploit the light and, as a result, enables a high photoelectric conversion efficiency to be realized.

The first hole transport layer 2 may contain both the p-type metal oxide semiconductor and the p-type organic semiconductor polymer. In the interior of the first hole transport layer 2, it is desirable that the p-type metal oxide semiconductor and the p-type organic semiconductor polymer be uniformly dispersed. When the p-type metal oxide semiconductor and the p-type organic semiconductor polymer are uniformly dispersed, a refractive index difference is reduced in the interior of the first hole transport layer 2. Consequently, since the first hole transport layer 2 can effectively pass the light, the photoelectric conversion efficiency can be improved.

Examples of the p-type metal oxide semiconductor include nickel oxide (NiO), copper(I) oxide ($Cu_2O$), and Copper(II) oxide (CuO). The p-type metal oxide semiconductor may be at least one selected from the group consisting of NiO, $Cu_2O$, and CuO.

Examples of the p-type organic semiconductor polymer include a phenyl amine containing a tertiary amine in the skeleton, a triphenylamine derivative, and a PEDOT compound having a thiophene structure. The p-type organic semiconductor polymer may be at least one selected from the group consisting of a phenyl amine containing a tertiary amine in the skeleton, a triphenylamine derivative, and a PEDOT compound having a thiophene structure.

Examples of the p-type organic semiconductor polymer include a poly[bis(4-phenyl)(2,4,6-triphenylmethyl)amine] (hereafter referred to as "PTAA"), (2,2',7,7'-tetrakis(N,N-di-p-methoxyphenylamino)-9,9'-spirobifluorene) (hereafter referred to as "Spiro-OMeTAD"), and PEDOT:PSS.

The first hole transport layer 2 may be realized by, for example, selecting at least one material from the above-described group of the p-type metal oxide semiconductors, selecting at least one material from the above-described group of the p-type organic semiconductor polymers, and combining the materials selected from the two groups.

It is desirable that the p-type metal oxide semiconductor is granular. The p-type metal oxide semiconductor having a granular shape enables the p-type metal oxide semiconductor to be uniformly dispersed in the p-type organic semiconductor polymer. In such an instance, the size of the p-type metal oxide semiconductor particle is smaller than the wavelength of the light absorbed by the solar cell 100 and is desirably less than or equal to one-quarter of the wavelength of the light. Due to the above-described configuration, the first hole transport layer 2 has low resistance suitable for the solar cell 100 and can realize a first hole transport layer capable of making the most of both the long-wavelength light and the short-wavelength light. Therefore, due to the above-described configuration, the solar cell 100 according to the first embodiment can effectively exploit the light and can realize a solar cell having a high photoelectric conversion efficiency.

The layers constituting the solar cell 100 according to the first embodiment and the configuration of the first hole transport layer 2 will be described later in detail.

Second Embodiment

Figure 2:
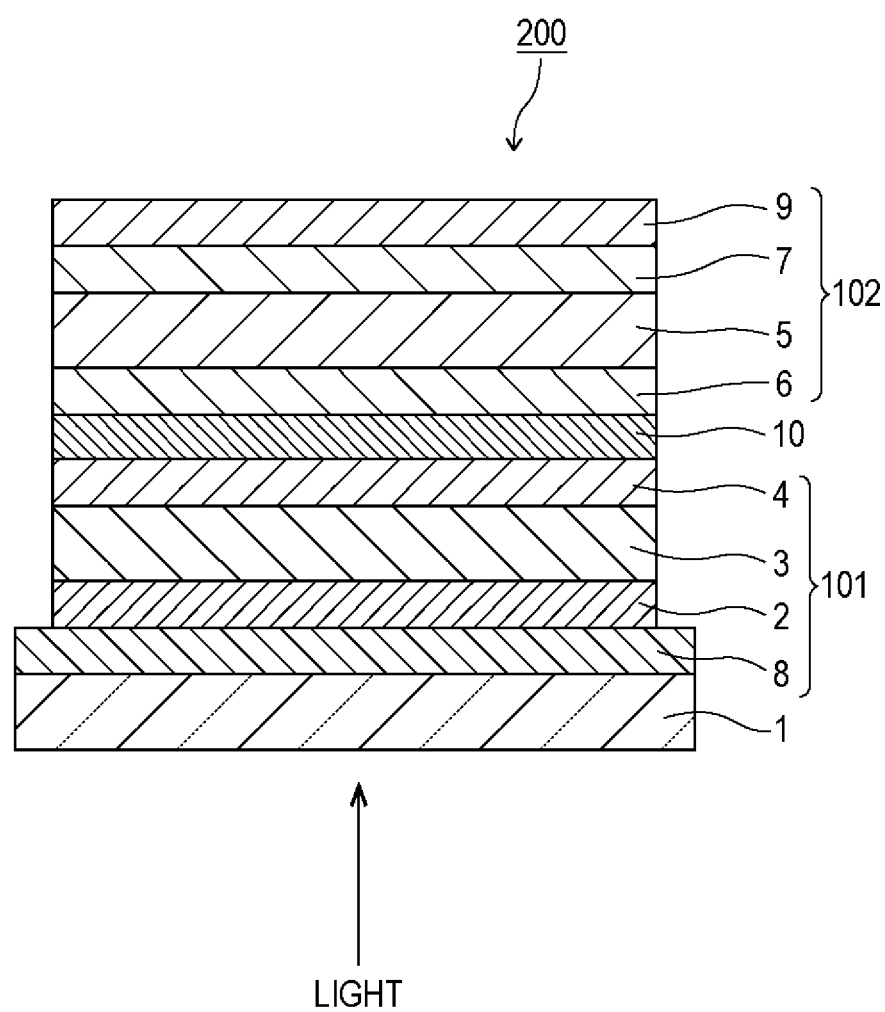
FIG. 2 is a schematic sectional view illustrating a perovskite tandem solar cell according to a second embodiment.

FIG. 2 is a schematic sectional view illustrating a perovskite tandem solar cell according to a second embodiment. A solar cell 200 according to the second embodiment has a configuration in which a plurality of layers are added to the solar cell 100 according to the first embodiment. As illustrated in FIG. 2, the solar cell 200 according to the second embodiment includes a top cell 101, an intermediate layer 10, and a bottom cell 102 on the first substrate 1. The intermediate layer 10 functions as a recombination layer in which an electron and a hole are recombined. In the top cell 101 according to the second embodiment, a first electrode layer 8, the first hole transport layer 2, the first photoelectric conversion layer 3, and the first electron transport layer 4 are disposed in this order. In this regard, in the bottom cell 102 according to the second embodiment, a second hole transport layer 6, the second photoelectric conversion layer 5, a second electron transport layer 7, and a second electrode layer 9 are disposed in this order. The intermediate layer 10 is disposed between the first electron transport layer 4 and the second hole transport layer 6. The second hole transport layer 6 is disposed between the intermediate layer 10 and the second photoelectric conversion layer 5. The second electron transport layer 7 is disposed so that the second electron transport layer 7, the second photoelectric conversion layer 5, and the second hole transport layer 6 are arranged in this order.

The solar cell 200 according to the second embodiment can generate electricity by connecting the first electrode layer 8 to the second electrode layer 9 through an external circuit during light irradiation.

The first hole transport layer 2, the first photoelectric conversion layer 3, and the second photoelectric conversion layer 5 have the configurations akin to those of the first hole transport layer 2, the first photoelectric conversion layer 3, and the second photoelectric conversion layer 5, respectively, described in the first embodiment. Therefore, the solar cell 200 according to the second embodiment can effectively exploit the light and, as a result, can realize a high photoelectric conversion efficiency in a manner similar to the solar cell 100 according to the first embodiment.

Third Embodiment

FIG. 3A is a schematic sectional view illustrating a perovskite tandem solar cell according to a third embodiment. A solar cell 300A according to the third embodiment has a configuration in which a plurality of layers are added to the solar cell 100 according to the first embodiment. As illustrated in FIG. 3A, in the solar cell 300A according to the third embodiment, a top cell 101 is disposed on the first substrate 1, and a bottom cell 102 is disposed on a second substrate 11. The top cell 101 is bonded to the bottom cell 102 with an intermediate layer 14 interposed therebetween. That is, the intermediate layer 14 functions as a bonding layer for bonding the top cell 101 to the bottom cell 102. In the top cell 101 according to the third embodiment, the first electrode layer 8, the first hole transport layer 2, the first photoelectric conversion layer 3, the first electron transport layer 4, and a third electrode layer 12 are disposed in this order. In this regard, in the bottom cell 102, a fourth electrode layer 13, the second hole transport layer 6, the second photoelectric conversion layer 5, the second electron transport layer 7, and the second electrode layer 9 are disposed in this order. The intermediate layer 14 is disposed between the third electrode layer 12 and the second substrate 11. The second substrate 11 is disposed between the intermediate layer 14 and the fourth electrode layer 13.

The solar cell 300A according to the third embodiment can generate electricity in the top cell 101 by connecting the first electrode layer 8 to the third electrode layer 12 through an external circuit during light irradiation. In addition, the bottom cell 102 can generate electricity by connecting the second electrode layer 9 to the fourth electrode layer 13 through an external circuit during light irradiation.

The first hole transport layer 2, the first photoelectric conversion layer 3, and the second photoelectric conversion layer 5 have the configurations akin to those of the first hole transport layer 2, the first photoelectric conversion layer 3, and the second photoelectric conversion layer 5, respectively, described in the first embodiment. Therefore, the solar cell 300A according to the third embodiment can effectively exploit the light and, as a result, can realize a high photoelectric conversion efficiency in a manner similar to the solar cell 100 according to the first embodiment.

FIG. 3B is a schematic sectional view illustrating a modified example of the perovskite tandem solar cell according to the third embodiment. As illustrated in FIG. 3B, in the bottom cell 102 of the solar cell 300B that is a modified example of the solar cell according to the third embodiment, the fourth electrode layer 13, the second electron transport layer 7, the second photoelectric conversion layer 5, the second hole transport layer 6, and the second electrode layer 9 maybe disposed in this order. The present configuration can also realize a high photoelectric conversion efficiency in a manner similar to the solar cell 300A illustrated in FIG. 3A.

Fourth Embodiment

Figure 4A:
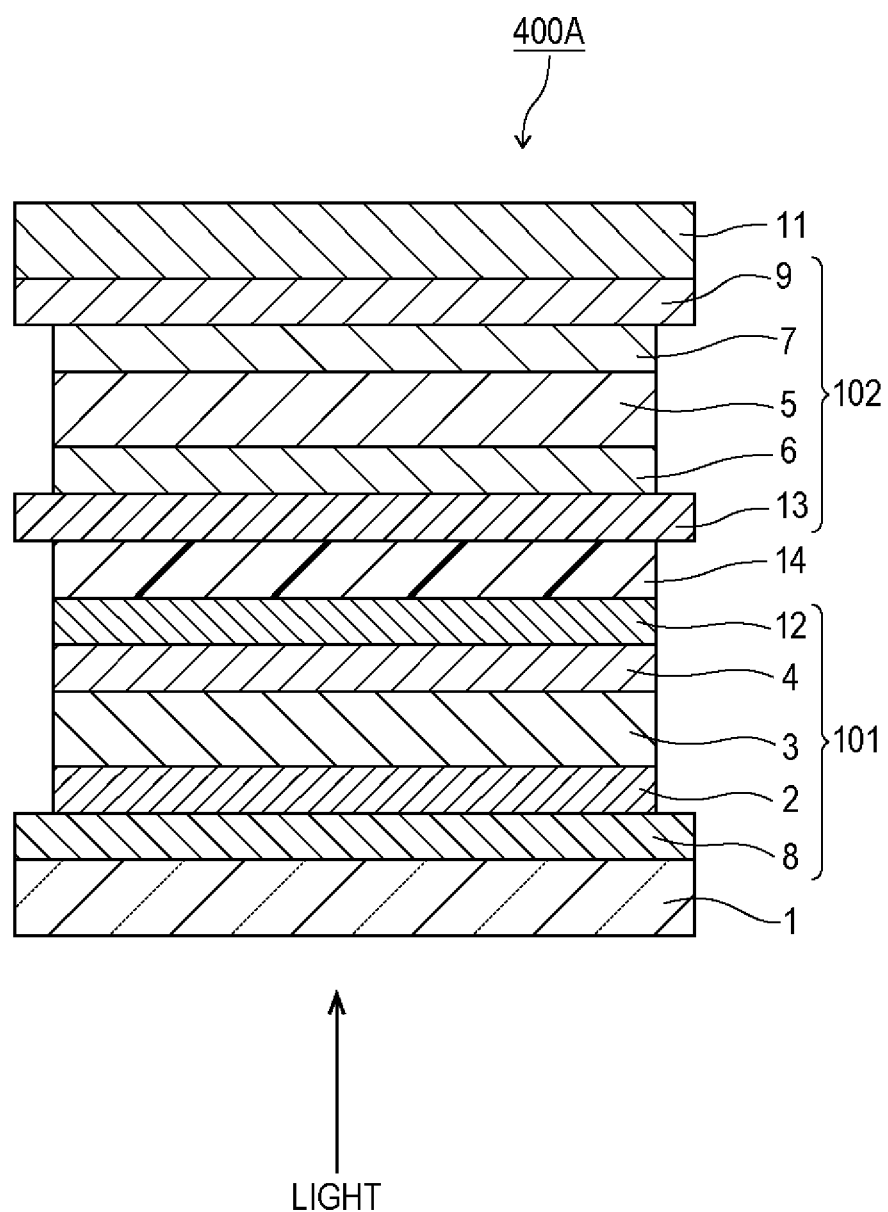
FIG. 4A is a schematic sectional view illustrating a perovskite tandem solar cell according to a fourth embodiment.

FIG. 4A is a schematic sectional view illustrating a perovskite tandem solar cell according to a fourth embodiment. A solar cell 400A according to the fourth embodiment has a configuration in which a plurality of layers are added to the solar cell 100 according to the first embodiment. As illustrated in FIG. 4A, in the solar cell 400A according to the fourth embodiment, a top cell 101 is disposed on the first substrate 1, and a bottom cell 102 is disposed on a second substrate 11. The top cell 101 is bonded to the bottom cell 102 with the intermediate layer 14 interposed therebetween. That is, the intermediate layer 14 functions as a bonding layer for bonding the top cell 101 to the bottom cell 102. In the top cell 101 according to the fourth embodiment, the first electrode layer 8, the first hole transport layer 2, the first photoelectric conversion layer 3, the first electron transport layer 4, and the third electrode layer 12 are disposed in this order. In this regard, in the bottom cell 102, the second electrode layer 9, the second electron transport layer 7, the second photoelectric conversion layer 5, the second hole transport layer 6, and the fourth electrode layer 13 are disposed in this order. The intermediate layer 14 is disposed between the third electrode layer 12 and the fourth electrode layer 13.

The solar cell 400A according to the fourth embodiment can generate electricity in the top cell 101 by connecting the first electrode layer 8 to the third electrode layer 12 through an external circuit during light irradiation. In addition, the bottom cell 102 can generate electricity by connecting the second electrode layer 9 to the fourth electrode layer 13 through an external circuit during light irradiation.

The first hole transport layer 2, the first photoelectric conversion layer 3, and the second photoelectric conversion layer 5 have the configurations akin to those of the first hole transport layer 2, the first photoelectric conversion layer 3, and the second photoelectric conversion layer 5, respectively, described in the first embodiment. Therefore, the solar cell 400A according to the fourth embodiment can effectively exploit the light and, as a result, can realize a high photoelectric conversion efficiency in a manner similar to the solar cell 100 according to the first embodiment.

Figure 4B:
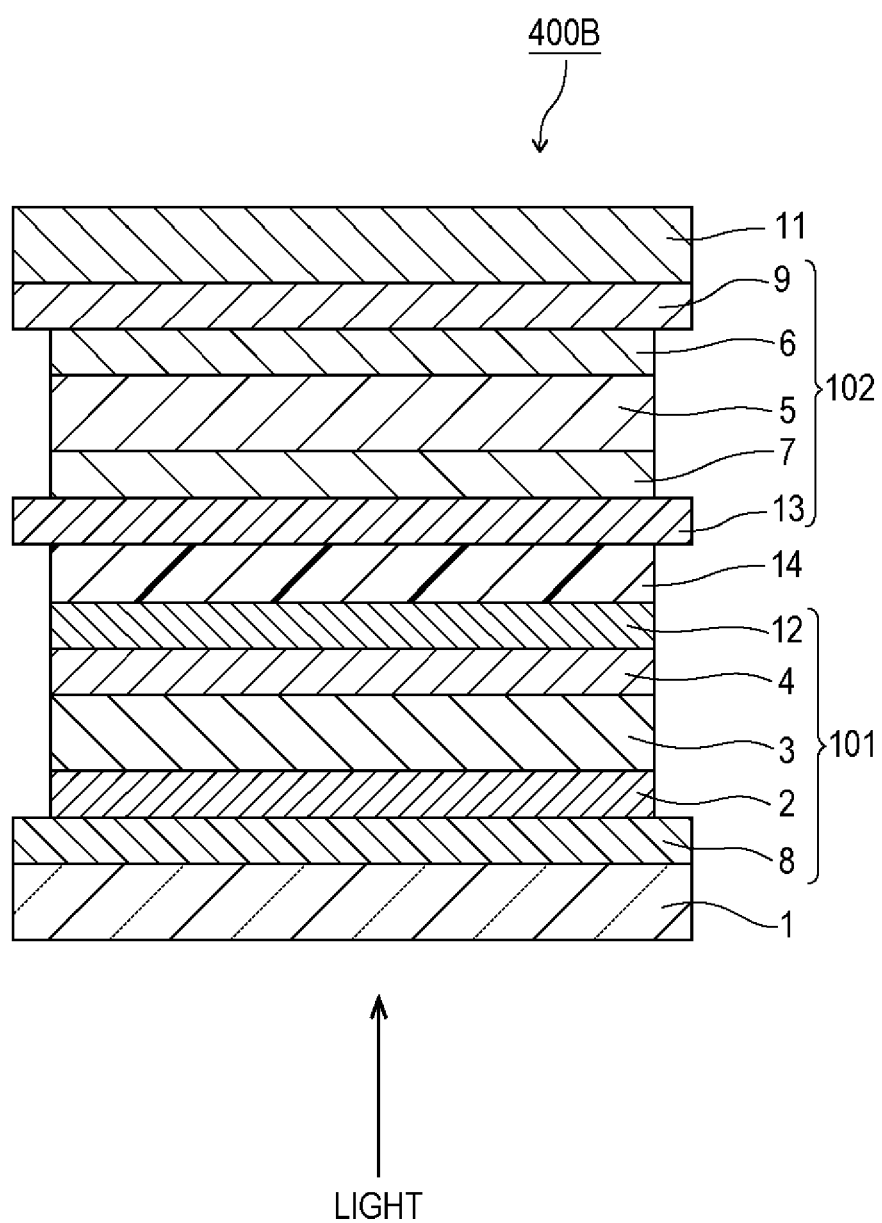
FIG. 4B is a schematic sectional view illustrating a modified example of the perovskite tandem solar cell according to the fourth embodiment.

FIG. 4B is a schematic sectional view illustrating a modified example of the perovskite tandem solar cell according to the fourth embodiment. As illustrated in FIG. 4B, in the bottom cell 102 of the solar cell 400B that is a modified example of the solar cell according to the fourth embodiment, the second electrode layer 9, the second hole transport layer 6, the second photoelectric conversion layer 5, the second electron transport layer 7, and the fourth electrode layer 13 may be disposed in this order. The present configuration can also realize a high photoelectric conversion efficiency in a manner similar to the solar cell 400A illustrated in FIG. 4A.

Fifth Embodiment

Figure 5:
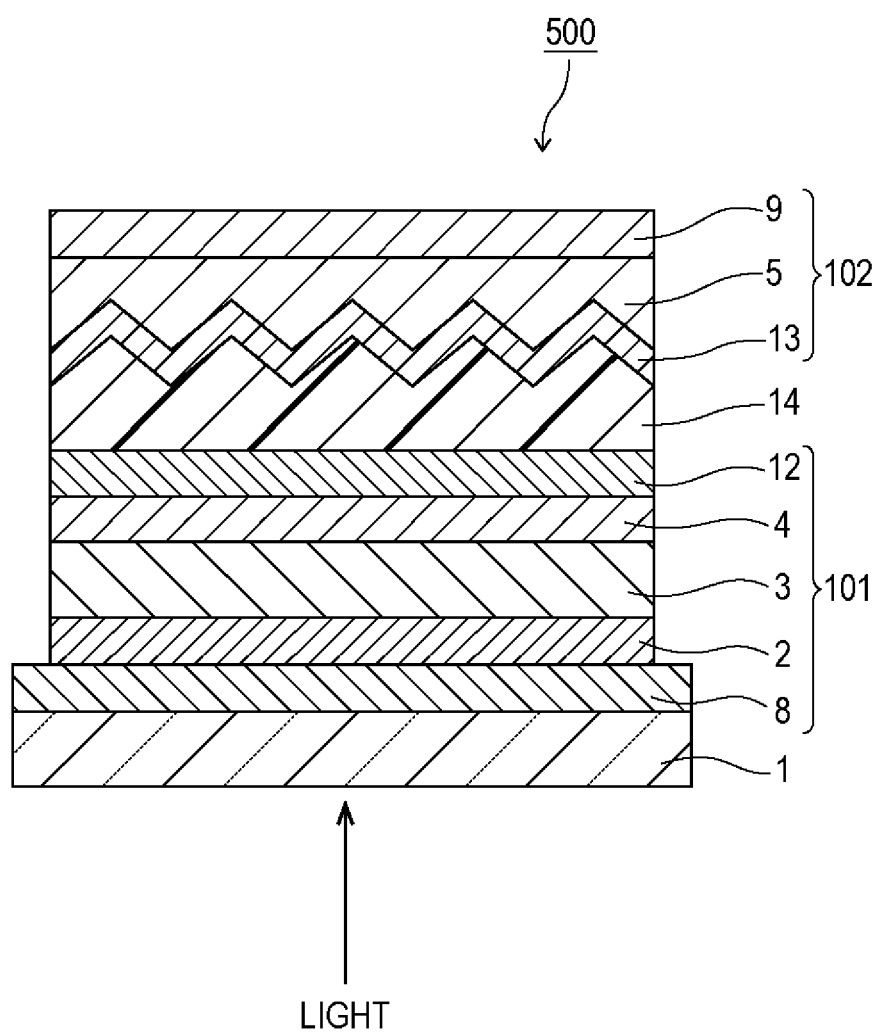
FIG. 5 is a schematic sectional view illustrating a perovskite tandem solar cell according to a fifth embodiment.

FIG. 5 is a schematic sectional view illustrating a perovskite tandem solar cell according to a fifth embodiment. A solar cell 500 according to the fifth embodiment has a configuration in which a plurality of layers are added to the solar cell 100 according to the first embodiment. As illustrated in FIG. 5, in the solar cell 500 according to the fifth embodiment, a top cell 101 and a bottom cell 102 are disposed on the first substrate 1. The top cell 101 is bonded to the bottom cell 102 with the intermediate layer 14 interposed therebetween. That is, the intermediate layer 14 functions as a bonding layer for bonding the top cell 101 to the bottom cell 102. In the top cell 101 according to the fifth embodiment, the first electrode layer 8, the first hole transport layer 2, the first photoelectric conversion layer 3, the first electron transport layer 4, and the third electrode layer 12 are disposed in this order. In this regard, in the bottom cell 102, the fourth electrode layer 13, the second photoelectric conversion layer 5, and the second electrode layer 9 are disposed in this order. The intermediate layer 14 is disposed between the third electrode layer 12 and the fourth electrode layer 13.

In the solar cell 500 according to the fifth embodiment, an uneven shape is disposed on a light-incident-side surface of the second photoelectric conversion layer 5, that is, on the lower-side surface in FIG. 5. The fourth electrode layer 13 is disposed so as to cover the uneven shape.

The solar cell according to the fifth embodiment can generate electricity in the top cell 101 by connecting the first electrode layer 8 to the third electrode layer 12 through an external circuit during light irradiation. In addition, the bottom cell 102 can generate electricity by connecting the second electrode layer 9 to the fourth electrode layer 13 through an external circuit during light irradiation.

The first hole transport layer 2, the first photoelectric conversion layer 3, and the second photoelectric conversion layer 5 have the configurations akin to those of the first hole transport layer 2, the first photoelectric conversion layer 3, and the second photoelectric conversion layer 5, respectively, described in the first embodiment. Therefore, the solar cell 500 according to the fifth embodiment can effectively exploit the light and, as a result, can realize a high photoelectric conversion efficiency in a manner similar to the solar cell 100 according to the first embodiment.

The layers constituting the solar cells according to the first embodiment to the fifth embodiment will be described below.

First Substrate 1

The first substrate 1 supports the layers of the top cell 101 that is a perovskite solar cell. The first substrate 1 can be formed of a transparent material. For example, a glass substrate or a plastic substrate (including a plastic film) can be used. In this regard, when the first electrode layer 8 has sufficient strength, since the layers can be supported by the first electrode layer 8, in such an instance, the first substrate 1 may also serve as an electrode layer. In other words, the first electrode layer capable of functioning as the first substrate 1 may be used.

First Hole Transport Layer 2

The hole transport layer is a layer for transporting holes. In the first embodiment to the fifth embodiment, the first hole transport layer 2 contains both the p-type metal oxide semiconductor and the p-type organic semiconductor polymer. In the first embodiment to the fifth embodiment, it is desirable that the p-type metal oxide semiconductor and the p-type organic semiconductor polymer be uniformly distributed in the interior of the first hole transport layer 2 as described in the first embodiment. Regarding the p-type metal oxide semiconductor, CuO, $Cu_2O$, NiO, or the like can be used. Regarding the p-type organic semiconductor polymer, PTAA, Spiro-OMeTAD, PEDOT:PSS, or the like can be used. The first hole transport layer 2 may be realized by selecting at least one material from the above-described group of the p-type metal oxide semiconductors, selecting at least one material from the above-described group of the p-type organic semiconductor polymers, and combining the resulting materials.

In this regard, it is desirable that the p-type metal oxide semiconductor be granular as described in the first embodiment. The p-type metal oxide semiconductor being granular enables the p-type metal oxide semiconductor to be uniformly dispersed in the p-type organic semiconductor polymer. In such an instance, the size of the particle is smaller than the wavelength of the light absorbed by the solar cell and is desirably less than or equal to one-quarter of the wavelength.

In the first hole transport layer 2, the p-type metal oxide semiconductor may be NiO, and the p-type organic semiconductor polymer may be PEDOT:PSS. NiO has a high refractive index with respect to, in particular, the long-wavelength light. PEDOT:PSS has a low refractive index with respect to the short-wavelength light and the long-wavelength light. Therefore, a predetermined refractive index in a wide range can be realized by combining NiO and PEDOT:PSS and appropriately adjusting the mixing ratio (for example, volume ratio) of NiO to PEDOT:PSS.

For example, when the first hole transport layer 2 is composed of a mixture of NiO and PEDOT:PSS, a volume ratio of the p-type organic semiconductor polymer to a total of the p-type metal oxide semiconductor and the p-type organic semiconductor polymer in the first hole transport layer 2 may be greater than or equal to 0.12 and less than or equal to 0.46. That is, the volume ratio is expressed as (volume of p-type organic semiconductor polymer)/{(volume of p-type metal oxide semiconductor)+(volume of p-type organic semiconductor polymer)}.

When the above-described volume ratio is greater than or equal to 0.12 and less than or equal to 0.46, the first hole transport layer 2 can have refractive indices with respect to the long-wavelength light and the short-wavelength light that are refractive indices positioned between the refractive index of the perovskite material and the refractive index of the material used for the first substrate 1 and that are refractive indices positioned between the refractive index of the perovskite compound and the refractive index of the electrode material which may be disposed between the first substrate 1 and the first hole transport layer 2. Therefore, according to this configuration, the light is made to efficiently reach the first photoelectric conversion layer 3 and the second photoelectric conversion layer 5, and the photoelectric conversion efficiency of the solar cell 100 can be improved.

Relational expression (1) above may be satisfied with respect to the light with a wavelength of 500 nm.

Further, Relational expression (2) above may be satisfied with respect to the light with a wavelength of 1,000 nm.

With respect to the light with the above-described wavelength, the first hole transport layer 2 satisfying Relational expression (1) and Relational expression (2) above enables the tandem solar cells according to the first embodiment to the fifth embodiment to effectively exploit the light and, as a result, enables a high photoelectric conversion efficiency to be realized.

In the instance of the configuration in which the first electrode layer 8 is disposed between the first substrate 1 and the first hole transport layer 2 as in the solar cells according to the second embodiment to the fifth embodiment, with respect to the light with a wavelength of 500 nm, the refractive index $n_A$ of the first hole transport layer 2 may satisfy Relational expression (3) below.

refractive index of the first electrode layer≤$n_A$≤refractive index of the first photoelectric conversion layer     Relational expression (3):

Further, in the instance of the above-described configuration, with respect to the light with a wavelength of 1,000 nm, the refractive index $n_B$ of the first hole transport layer 2 may satisfy Relational expression (4) below.

refractive index of the first electrode layer≤$n_B$≤refractive index of the first photoelectric conversion layer     Relational expression (4):

The first hole transport layer 2 satisfying Relational expression (3) and Relational expression (4) above enables the tandem solar cells according to the second embodiment to the fifth embodiment to more effectively exploit the light and, as a result, enables a higher photoelectric conversion efficiency to be realized.

The refractive index $n_A$ of the first hole transport layer 2 with respect to the light with a wavelength of 500 nm may be greater than or equal to 2.00 and less than or equal to 2.61. In addition, the refractive index $n_B$ of the first hole transport layer with respect to the light with a wavelength of 1,000 nm may be greater than or equal to 1.75 and less than or equal to 2.17. When the first hole transport layer 2 have the refractive indices in the above-described ranges with respect to the wavelength of 500 nm and the wavelength of 1,000 nm, the first hole transport layer 2 readily satisfies Relational expressions (1) to (4) above with respect to the materials frequently used for the first substrate 1, the first electrode layer 8, and the first photoelectric conversion layer 3, in general. Therefore, the refractive indices $n_A$ and $n_B$ satisfying the above-described ranges enable the tandem solar cells according to the first embodiment to the fifth embodiment to more effectively exploit the light and, as a result, enables a higher photoelectric conversion efficiency to be realized.

The thickness of the first hole transport layer 2 is desirably greater than or equal to 1 nm and less than or equal to 1,000 nm, more desirably greater than or equal to 10 nm and less than or equal to 500 nm, and further desirably greater than or equal to 10 nm and less than or equal to 50 nm. The thickness of the first hole transport layer 2 being greater than or equal to 1 nm and less than or equal to 1,000 nm enables sufficient hole transportability to be realized. Further, when the thickness of the first hole transport layer 2 is greater than or equal to 1 nm and less than or equal to 1,000 nm, the light is converted to electricity with a high efficiency since the resistance of the first hole transport layer 2 is low.

The first hole transport layer 2 may contain a support electrolyte and a solvent. The support electrolyte and the solvent have an effect of, for example, stabilizing holes in the first hole transport layer 2.

Examples of the support electrolyte include ammonium salts and alkali metal salts. Examples of the ammonium salt include tetrabutylammonium perchlorate, tetraethylammonium hexafluorophosphate, imidazolium salts, and pyridinium salts. Examples of the alkali metal salt include lithium perchlorate and potassium tetrafluoroborate.

The solvent contained in the first hole transport layer 2 may have high ionic conductivity. The solvent may be an aqueous solvent or an organic solvent. It is desirable that the solvent be an organic solvent from the viewpoint of stabilization of a solute. Examples of the organic solvent include heterocyclic compounds, such as tert-butyl pyridine, pyridine, and N-methylpyrrolidone.

The solvent contained in the first hole transport layer 2 may be an ionic liquid. The ionic liquid may be used alone or in combination with other solvents. The ionic liquid is desirable from the viewpoint of low volatility and high flame retardancy.

Examples of the ionic liquid include imidazolium compounds such as 1-ethyl-3-methylimidazolium tetracyanoborate, pyridine compounds, alicyclic amine compounds, aliphatic amine compounds, and azoniumamine compounds.

First Photoelectric Conversion Layer 3

The first photoelectric conversion layer 3 contains a perovskite compound. That is, the first photoelectric conversion layer 3 contains the first perovskite compound composed of a monovalent cation, a divalent cation, and a halogen anion as a photoelectric conversion material. The photoelectric conversion material is a light-absorbing material.

In the present embodiment, the perovskite compound may be a compound denoted by a chemical formula $ABX_3$ (herein, A represents a monovalent cation, B represents a divalent cation, and X represents a halogen anion).

In the present specification, A, B, and X are also referred to as an A site, a B site, and an X site, respectively, in accordance with an expression idiomatically used for the perovskite compound.

In the present embodiment, the perovskite compound may have a perovskite type crystal structure denoted by the chemical formula $ABX_3$. As an example, a monovalent cation is located at the A site, a divalent cation is located at the B site, and a halogen anion is located at the X site.

A Site

There is no particular limitation regarding the monovalent cation located at the A site. An example of the monovalent cation is an organic cation or an alkali metal cation. An example of the organic cation is a methylammonium cation (that is, $CH_3NH_3^+$), a formamidinium cation (that is, $NH_2CHNH_2^+$), a phenylethylammonium cation (that is, $C_6H_5C_2H_4NH_3^+$), or a guanidium cation, (that is, $CH_6N_3^+$). An example of the alkali metal cation is a cesium cation (that is, CO.

For the sake of a high photoelectric conversion efficiency, the A site may include at least one selected from the group consisting of $Cs^+$, a formamidinium cation, and a methylammonium cation.

The cation constituting the A site may be composed of a mixture of a plurality of organic cations described above. The cation constituting the A site may be a mixture of at least one of the above-described organic cations and at least one of the above-described metal cations.

B Site

There is no particular limitation regarding the divalent cation located at the B site. An example of the divalent cation A is a divalent cation of an element of group XIII to group XV. For example, the B site includes a Pb cation, that is, $Pb^{2+}$.

X Site

There is no particular limitation regarding the halogen anion located at the X site.

The element, that is, the ion, located at each of the A, B, and X sites may be a plurality of types or a single type.

Specific examples of the perovskite compounds include $CH_3NH_3PbI_3$, $CH_3CH_2NH_3PbI_3$, $HC(NH_2)_2PbI_3$, $CH_3NH_3PbBr_3$, $CH_3NH_3Cl_3$, $CsPbI_3$, and $CsPbBr_3$.

The first photoelectric conversion layer 3 may contain materials other than photoelectric conversion materials. For example, the first photoelectric conversion layer 3 may further contain a quencher substance for reducing the defect density of the perovskite compound. The quencher substance is a fluorine compound such as tin fluoride. The molar ratio of the quencher substance to the photoelectric conversion material may be greater than or equal to 5% and less than or equal to 20%.

The first photoelectric conversion layer 3 may mainly contain a perovskite compound composed of a monovalent cation, a divalent cation, and a halogen anion.

The sentence "the first photoelectric conversion layer 3 mainly contains a perovskite compound composed of a monovalent cation, a divalent cation, and a halogen anion" means that the first photoelectric conversion layer 3 contains greater than or equal to 70% (desirably greater than or equal to 80%) of the perovskite compound composed of a monovalent cation, a divalent cation, and a halogen anion.

The first photoelectric conversion layer 3 may contain impurities. The first photoelectric conversion layer 3 may further contain compounds other than the above-described perovskite compound.

The first photoelectric conversion layer 3 may have a thickness of, for example, greater than or equal to about 100 nm and less than or equal to about 2,000 nm. The perovskite compound contained in the first photoelectric conversion layer 3 may be formed using a solution coating method, a co-vapor deposition method, or the like.

In this regard, the first photoelectric conversion layer 3 may take on a form in which a portion is mixed with the above-described first hole transport layer 2 and the first electron transport layer 4 described later or a form in which there are large-area interfaces to the first electron transport layer 4 and to the first hole transport layer 2 in the film.

The top cell 101 has to pass the long-wavelength light to the bottom cell 102. In other words, the top cell 101 is required to absorb the short-wavelength light. Therefore, the band gap of the perovskite compound contained in the first photoelectric conversion layer 3 is greater than the band gap of the photoelectric conversion material contained in the second photoelectric conversion layer 5. For example, the perovskite compound contained in the first photoelectric conversion layer 3 is $MAPbI_3$, $FAPbI_3$, $MAPbBr_3$, or $FAPbBr_3$.

First Electron Transport Layer 4

The first electron transport layer 4 is in contact with, for example, the first photoelectric conversion layer 3 and the third electrode layer 12. The first electron transport layer 4 transports electrons. The first electron transport layer 4 contains a semiconductor. It is desirable that the first electron transport layer 4 is formed of a semiconductor having a band gap of greater than or equal to 3.0 eV. Examples of the semiconductor include organic or inorganic n-type semiconductors.

Examples of the organic n-type semiconductor include imide compounds, quinone compounds, fullerene, and derivatives of the fullerene. Examples of the inorganic n-type semiconductor include metal oxides, metal nitrides, and perovskite oxides. Examples of the metal oxide include oxides of Cd, Zn, In, Pb, Mo, W, Sb, Bi, Cu, Hg, Ti, Ag, Mn, Fe, V, Sn, Zr, Sr, Ga, Si, or Cr. $TiO_2$ is desirable. Examples of the metal nitride include GaN. Examples of the perovskite oxide include $SrTiO_3$, $CaTiO_3$, and $ZnTiO_3$.

The first electron transport layer 4 may be composed of a material having a band gap of greater than 6.0 eV. Examples of the material having a band gap of greater than 6.0 eV include
 (i) halides of alkali metals or alkaline-earth metals, such as lithium fluoride and barium fluoride, and
 (ii) oxides of alkaline-earth metals, such as magnesium oxide.
In such an instance, to ensure the electron transportability of the first electron transport layer 4, the thickness of the first electron transport layer 4 is, for example, less than or equal to 10 nm.

The first electron transport layer 4 may contain a plurality of layers composed of materials that differ from each other.

In this regard, when an electrode in contact with the first electron transport layer 4 has a property of blocking holes from the first photoelectric conversion layer 3, the electron transport material is not limited to being present. Herein, the property of blocking holes means that the first photoelectric conversion layer 3 is not in ohmic contact with the electrode. Examples of the electrode material having such a function include aluminum.

Second Photoelectric Conversion Layer 5

A photoelectric conversion material used for the second photoelectric conversion layer 5 has a smaller band gap than the perovskite compound that is a photoelectric conversion material used for the first photoelectric conversion layer 3. Examples of the materials used for the second photoelectric conversion layer 5 include silicon, perovskite compounds, chalcopyrite-type compounds such as CIGS, and group III-V compounds such as GaAs.

The second photoelectric conversion layer 5 may take on a form in which a portion is mixed with the second electron transport layer 7 and the second hole transport layer 6 described later or a form in which there are large-area interfaces in the film.

Second Hole Transport Layer 6

The second hole transport layer 6 contains a hole transport material. The hole transport material is a material for transporting holes. Examples of the hole transport material include organic materials and inorganic semiconductors.

Typical examples of the organic material and the inorganic semiconductor used as the hole transport material contained in the second hole transport layer 6 are akin to those used as the hole transport material contained in the first hole transport layer 2.

The second hole transport layer 6 may contain a plurality of layers formed of materials that differ from each other.

The thickness of the second hole transport layer 6 is desirably greater than or equal to 1 nm and less than or equal to 1,000 nm, more desirably greater than or equal to 10 nm and less than or equal to 500 nm, and further desirably greater than or equal to 10 nm and less than or equal to 50 nm. The thickness of the second hole transport layer 6 being greater than or equal to 1 nm and less than or equal to 1,000 nm enables sufficient hole transportability to be realized. Further, the thickness of the second hole transport layer 6 being greater than or equal to 1 nm and less than or equal to 1,000 nm enables the light to be converted to electricity with high efficiency since the second hole transport layer 6 has low resistance.

Regarding a method for forming the film, known various coating methods or printing methods can be adopted. Examples of the coating method include a doctor blade method, a bar coating method, a spraying method, a dip coating method, and a spin coating method. Examples of the printing method include a screen printing method.

The second hole transport layer 6 may contain a support electrolyte and a solvent. The support electrolyte and the solvent have an effect of, for example, stabilizing holes in the second hole transport layer 6.

Examples of the support electrolyte and the solvent which may be contained in the second hole transport layer 6 are akin to examples of the support electrolyte and the solvent which may be contained in the first hole transport layer 2.

Second Electron Transport Layer 7

The second electron transport layer 7 is a layer having the function akin to the function of the first electron transport layer 4, and similar material and configuration can be used.

First Electrode Layer 8

The first electrode layer 8 has electrical conductivity. In addition, the first electrode layer 8 has a light-transmitting property. For example, the first electrode layer 8 can pass the light in the visible region to the near-infrared region. The first electrode layer 8 may be formed using, for example, a metal oxide that is transparent and that has electrical conductivity. An Example of such a metal oxide is
(i) an indium-tin complex oxide,
(ii) a tin oxide doped with antimony,
(iii) a tin oxide doped with fluorine,
(iv) a zinc oxide doped with at least one selected from the group consisting of boron, aluminum, gallium, and indium, or
(v) a complex of these.

The first electrode layer 8 can be formed by using an opaque material and by being formed into a pattern through which the light passes. An example of the pattern through which the light passes is a linear pattern, a wavy-line-like pattern, a grid-like pattern, or a punching-metal-like pattern in which a plurality of fine through holes are regularly or irregularly arranged. The first electrode layer 8 having these patterns enables the light to pass through portions with no electrode layer material. An example of the opaque material is platinum, gold, silver, copper, aluminum, rhodium, indium, titanium, iron, nickel, tin, zinc, or an alloy containing any one of these. A carbon material having electrical conductivity may be used as the opaque material.

The light transmittance of the first electrode layer 8 may be, for example, greater than or equal to 50%, or may be greater than or equal to 80%. The wavelength of the light which has to pass through the first electrode layer 8 is in accordance with the absorption wavelength of the first photoelectric conversion layer 3 and the second photoelectric conversion layer 5. The thickness of the first electrode layer 8 is, for example, greater than or equal to 1 nm and less than or equal to 1,000 nm.

Second Electrode Layer 9, Third Electrode Layer 12, and Fourth Electrode Layer 13

The second electrode layer 9, the third electrode layer 12, and the fourth electrode layer 13 are layers having the function akin to the function of the first electrode layer 8, and similar material and configuration can be used.

In this regard, when the second electrode layer 9 is disposed at a position furthest from the light incident side (lower side in FIG. 2) as in the solar cell 200 according to the second embodiment, the second electrode layer 9 is not limited to having a light-transmitting property, and an opaque material can be used without further processing.

The intermediate layer 10 functioning as a recombination layer is disposed between the top cell 101 and the bottom cell 102 and is a layer for realizing electrical connection. The intermediate layer 10 has electrical conductivity. In addition, the intermediate layer 10 has a light-transmitting property. The intermediate layer 10 passes, for example, the light in the visible region to the near-infrared region.

The intermediate layer 10 may be formed using, for example, a metal oxide that is transparent and that has electrical conductivity. An Example of such a metal oxide is
(i) an indium-tin complex oxide,
(ii) a tin oxide doped with antimony,
(iii) a tin oxide doped with fluorine,
(iv) a zinc oxide doped with at least one selected from the group consisting of boron, aluminum, gallium, and indium, or
(v) a complex of these.

The intermediate layer 10 can be formed by using an opaque material and by being formed into a pattern through which the light passes. An example of the pattern through which the light passes is a linear pattern, a wavy-line-like pattern, a grid-like pattern, or a punching-metal-like pattern in which a plurality of fine through holes are regularly or irregularly arranged. The intermediate layer 10 having these patterns enables the light to pass through portions with no opaque material. An example of the opaque material is platinum, gold, silver, copper, aluminum, rhodium, indium, titanium, iron, nickel, tin, zinc, or an alloy containing any one of these. A carbon material having electrical conductivity may be used as the opaque material.

Intermediate Layer 14 Functioning as Bonding Layer

The intermediate layer 14 functioning as a bonding layer is disposed between the top cell 101 and the bottom cell 102 and is a layer for mechanically supporting the top cell 101 and the bottom cell 102. The intermediate layer 14 has a light-transmitting property. The intermediate layer 14 passes, for example, the light in the visible region to the near-infrared region.

The intermediate layer 14 may be formed using, for example, a transparent resin material. Examples of the material for forming the intermediate layer 14 include polymethyl methacrylate resins, silicon resins, and epoxy resins.

Alternatively, the intermediate layer 14 can be formed by using an opaque material and by being formed into a pattern through which the light passes. An example of the pattern through which the light passes is a linear pattern, a wavy-line-like pattern, a grid-like pattern, or a punching-metal-like pattern in which a plurality of fine through holes are regularly or irregularly arranged. Examples of the opaque material include metal materials and opaque resin materials.

Example of Method for Producing Solar Cell

Regarding the top cell 101 in the solar cell according to the present embodiment, each of the first electrode layer 8, the first hole transport layer 2, the first photoelectric conversion layer 3, the first electron transport layer 4, and the third electrode layer 12 may be formed on the first substrate 1 by using, for example, a coating method represented by spin coating, spray coating, die coating, ink jet, gravure coating, flexographic coating, or the like, a physical vapor deposition method (PVD) represented by vapor deposition, sputtering, or the like, or a chemical vapor deposition method (CVD) by using heat, light, plasma, or the like. Likewise, regarding the bottom cell 102, the fourth electrode layer 13, the second hole transport layer 6, the second photoelectric conversion layer 5, the second electron transport layer 7, and the second electrode layer 9 may be formed by using, for example, a coating method represented by spin coating, spray coating, die coating, ink jet, gravure coating, flexographic coating, or the like, PVD represented by vapor deposition, sputtering, or the like, or CVD by using heat, light, plasma, or the like. Thereafter, the solar cell can be formed by integrating the top cell 101 and the bottom cell 102 by using the intermediate layer 10 or the intermediate layer 14.

Optimum Mixing Ratio of p-Type Metal Oxide Semiconductor to p-Type Organic Semiconductor Polymer The first hole transport layer 2 in the solar cell according to the present embodiment has a configuration in which a p-type metal oxide semiconductor and a p-type organic semiconductor polymer are mixed. In such an instance, Formula (3) below applies where the refractive index of the p-type metal oxide semiconductor is denoted by N1, the refractive index of the p-type organic semiconductor polymer is denoted by N2, the volume fraction of the p-type organic semiconductor polymer in the first hole transport layer 2 is denoted by f, and the refractive index of the first hole transport layer 2 is denoted by N.

[Math. 1]

$$f[(N1^2-N^2)/(N1^2+2N^2)]+(1-f)[(N2^2-N^2)/(N2^2+2N^2)]=0 \quad (3)$$

The refractive index N of the first hole transport layer 2 at specific mixing ratio can be determined by solving Formula (3).

It is desirable that the refractive index of the first hole transport layer 2 be greater than the refractive index of the first electrode layer 8 and less than the refractive index of the first photoelectric conversion layer 3 in a long-wavelength (for example, 1,000 nm) region. In such an instance, specifying the materials for forming the first electrode layer 8, the first photoelectric conversion layer 3, the p-type organic semiconductor polymer, and the p-type metal oxide semiconductor enables an optimum range of the mixing ratio of the p-type metal oxide semiconductor to the p-type organic semiconductor polymer to be determined in accordance with the material configuration.

Figure 6:
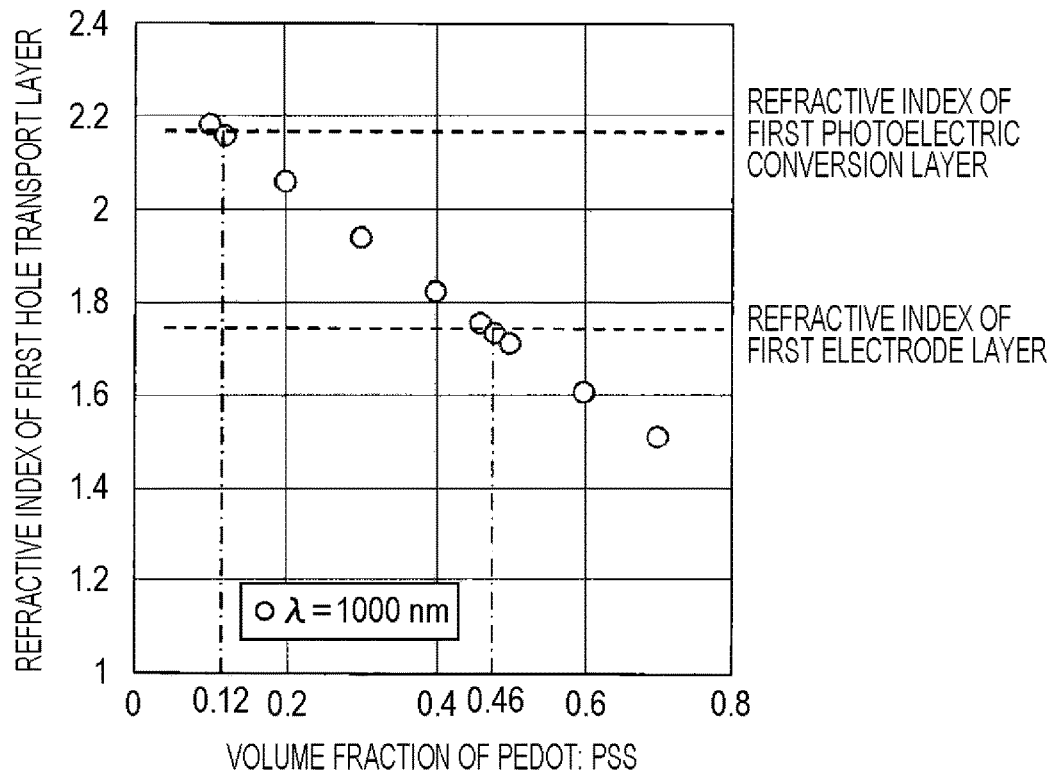
FIG. 6 is a graph illustrating dependence of the refractive index of the first hole transport layer with respect to the light with a wavelength of 1,000 nm on a volume fraction of a poly(3,4-ethylenedioxythiophene) doped with a poly(4-styrenesulfonic acid) (hereafter referred to as "PEDOT:PSS")

As an example, an optimum ratio range was calculated when indium oxide doped with tin was used for the first electrode layer 8, a perovskite compound in which Cs, $CH_3NH_3$, and $HC(NH_2)_2$ were used at the A site, Pb was used at the B site, and I and Br were used at the X site was used for the first photoelectric conversion layer 3, PEDOT:PSS was used for the p-type organic semiconductor polymer, and NiO was used for the p-type metal oxide semiconductor. FIG. 6 is a graph illustrating dependence of the refractive index of the first hole transport layer 2 with respect to the light with a wavelength of 1,000 nm on a volume fraction of PEDOT:PSS. Specifically, the horizontal axis represents the volume fraction of PEDOT:PSS (that is, the volume fraction of PEDOT:PSS relative to a total of PEDOT:PSS and NiO), and the vertical axis represents the refractive index of the first hole transport layer 2. It is desirable that the refractive index of the first hole transport layer 2 be within the range between the refractive index of the first electrode layer 8 and the refractive index of the first photoelectric conversion layer 3. Therefore, it is desirable that the volume fraction of PEDOT:PSS be set to be within the range of greater than or equal to 0.12 and less than or equal to 0.46.

EXAMPLES

The present invention will be described in more detail with reference to the examples below.

Example 1

A method for producing a solar cell of Example 1 will be described below.

To begin with, a method for producing a top cell in the solar cell of Example 1 will be described.

Initially, a glass substrate having a thickness of 0.7 mm was prepared as a first substrate.

Subsequently, a tin-doped indium oxide layer having a thickness of 150 nm was formed as a first electrode layer on the first substrate by using a sputtering method.

Thereafter, a first hole transport layer was formed on the first electrode layer by applying a raw material solution for the first hole transport layer by using a spin coating method. The raw material solution for the first hole transport layer was formed by mixing a PEDOT:PSS dispersion liquid (produced by Heraeus) and a NiO nanoparticle dispersion liquid (produced by NanoGrade) at 1:1 (volume fraction), dispersing NiO nanoparticles by applying ultrasonic waves, and, thereafter, filtering the solution with a filter (openings: 0.2 μm).

Next, the first hole transport layer was coated with a raw material solution for a first photoelectric conversion layer by using a spin coating method so as to form the first photoelectric conversion layer. A raw material solution for the first photoelectric conversion layer was produced by dissolving 0.92 mol/L of $PbI_2$ (produced by TOKYO KASEI KOGYO CO., LTD.), 0.17 mol/L of $PbBr_2$ (produced by TOKYO KASEI KOGYO CO., LTD.), 0.83 mol/L of formamidinium iodide (produced by GreatCell Solar) (hereafter referred to as "FAI"), 0.17 mol/L of methylammonium bromide (produced by GreatCell Solar) (hereafter referred to as "MABr"), and 0.05 mol/L of CsI (produced by Iwatani Corporation) in a solvent mixture of dimethylsulfoxide (produced by acros) and N-dimethylformamide (produced by acros). Regarding the solvent mixture used for the raw material solution for the first photoelectric conversion layer, the mixing ratio of dimethylsulfoxide to N-dimethylformamide was 1:4 (volume ratio).

Thereafter, a first electron transport layer was formed on the first photoelectric conversion layer by successively forming films of fullerene having a thickness of 25 nm and bathocuproin (BCP) having a thickness of 5 nm by using a vapor deposition method.

Subsequently, a third electrode layer was formed on the first electron transport layer by forming a tin-doped indium oxide layer having a thickness of 200 nm by using a sputtering method.

The top cell in the solar cell of Example 1 was obtained through the above-described steps.

Next, a method for producing a bottom cell in the solar cell of Example 1 will be described.

Initially, a glass substrate having a thickness of 0.7 mm was prepared as a second substrate.

Thereafter, a tin-doped indium oxide layer having a thickness of 150 nm was formed as a fourth electrode on the second substrate by using a sputtering method.

Subsequently, a second hole transport layer was formed on the fourth electrode by applying a raw material solution for the second hole transport layer by using a spin coating method. Regarding the solution, a PEDOT:PSS dispersion liquid (produced by Heraeus) was used.

Next, the second hole transport layer was coated with a raw material solution for a second photoelectric conversion layer by using a spin coating method so as to form the second photoelectric conversion layer. A raw material solution for the second photoelectric conversion layer was produced by dissolving 0.84 mol/L of $SnI_2$ (produced by TOKYO KASEI KOGYO CO., LTD.), 0.84 mol/L of FAI (produced by GreatCell Solar), 0.69 mol/L of $PbI_2$ (produced by TOKYO KASEI KOGYO CO., LTD.), and 0.69 mol/L of methylammonium iodide (produced by GreatCell Solar) (hereafter referred to as "MAI") in a solvent mixture of dimethylsulfoxide (produced by acros) and N-dimethylformamide (produced by acros). Regarding the solvent mixture used for the raw material solution for the second photoelectric conversion layer, the mixing ratio of dimethylsulfoxide to N-dimethylformamide was 1:4 (volume ratio).

Thereafter, a second electron transport layer was formed on the second photoelectric conversion layer by successively forming films of fullerene having a thickness of 25 nm and bathocuproin (BCP) having a thickness of 5 nm by using a vapor deposition method.

Subsequently, a second electrode layer was formed on the second electron transport layer by forming a silver film having a thickness of 100 nm by using a vapor deposition method.

The bottom cell in the solar cell of Example 1 was obtained through the above-described steps.

The solar cell of Example 1 was obtained by using an epoxy resin as an intermediate layer and bonding the third electrode layer of the top cell to the second substrate of the bottom cell. That is, the solar cell of Example 1 had a configuration akin to the configuration of the solar cell 300A according to the third embodiment illustrated in FIG. 3A.

Comparative Example 1

Regarding a solar cell of Comparative example 1, the PEDOT:PSS dispersion liquid (produced by Heraeus) was used as a raw material solution for the first hole transport layer. The other steps were akin to the steps in Example 1.

Comparative Example 2

Regarding a solar cell of Comparative example 2, the NiO nanoparticle dispersion liquid (produced by NanoGrade) was used as a raw material solution for the first hole transport layer. The other steps were akin to the steps in Example 1.

Performance comparisons between solar cells of Example 1, Comparative example 1, and Comparative Example 2

The photoelectric conversion efficiencies of the top cells in the solar cells of Example 1, Comparative example 1, and Comparative example 2 were measured. A solar simulator (produced by Bunkoukeiki Co., Ltd.) and an electrochemical analyzer ALS (produced by BAS Inc.) were used for measuring the photoelectric conversion efficiency. The quasi-solar light (illumination intensity of 100 mW/cm$^2$) which was reproduced so as to have a spectrum closely analogous to the solar light was realized by the solar simulator. The quasi-solar light was applied to the top cell. The top cell irradiated with the quasi-solar light was subjected to the measurement of the output current value while the applied voltage was changed by using the electrochemical analyzer so that the current-voltage characteristics (hereafter referred to as I-V characteristics) of the solar cell were measured. The photoelectric conversion efficiency was calculated from an open-circuit voltage, a short-circuit current, and a fill factor of the resulting I-V characteristics.

Figure 7:
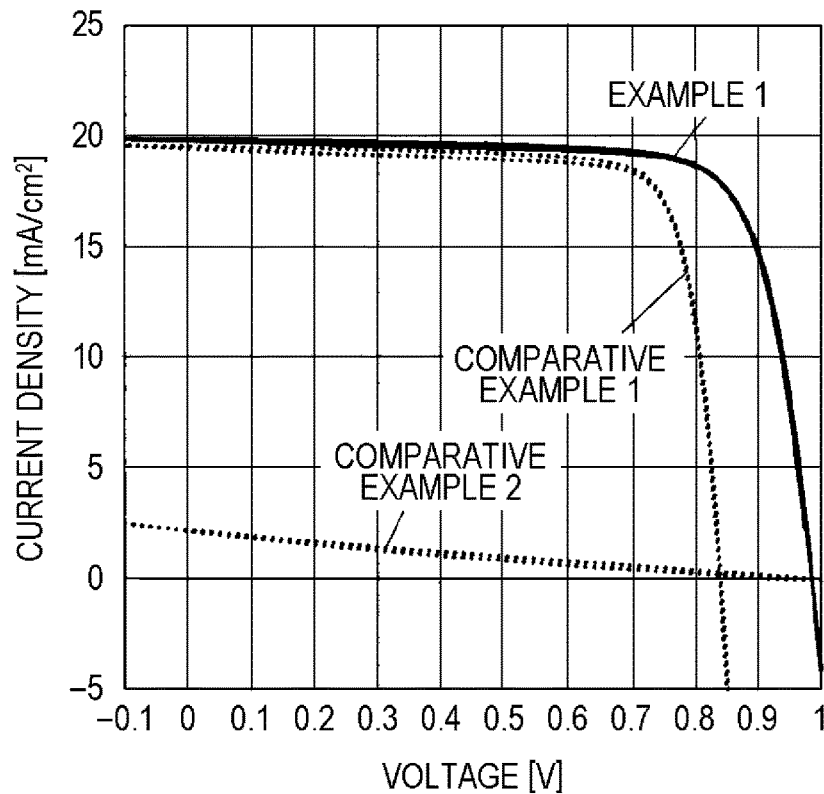
FIG. 7 is a graph illustrating current-voltage characteristics of a top cell in a solar cell of Example 1, Comparative example 1, or Comparative example 2 during quasi-solar light irradiation.

FIG. 7 is a graph illustrating I-V characteristics of the top cell in the solar cell of Example 1, Comparative example 1, or Comparative example 2 during quasi-solar light irradiation. Specifically, the horizontal axis in FIG. 7 represents the voltage, and the vertical axis represents the current density. As illustrated in FIG. 7, it can be ascertained that the top cell in the solar cell of Example 1 has higher short-circuit current than Comparative example 1 and Comparative example 2. In such an instance, as presented in Table 1, regarding the conversion efficiency of the top cell in the solar cell, the solar cell of Example 1 was 15.1%, the solar cell of Comparative example 1 was 14.5%, and the solar cell of Comparative example 2 was 0.5%. Therefore, it can be ascertained that the efficiency of the solar cell is improved due to the configuration of Example 1.

Next, the transmittance of the top cell in the solar cell was measured regarding Example 1 and Comparative example 1. The transmittance was measured using UV-VIS-NIR Spectrophotometer SolidSpec-3700 (produced by SHIMADZU CORPORATION). The measurement light was applied to the top cell while the wavelength was changed within the range of 300 nm to 1,300 nm. In such an instance, after the light passed through the top cell was introduced into an integrating sphere and dispersed, the intensity was measured using a detector so that the transmittance at each wavelength was obtained.

Figure 8:
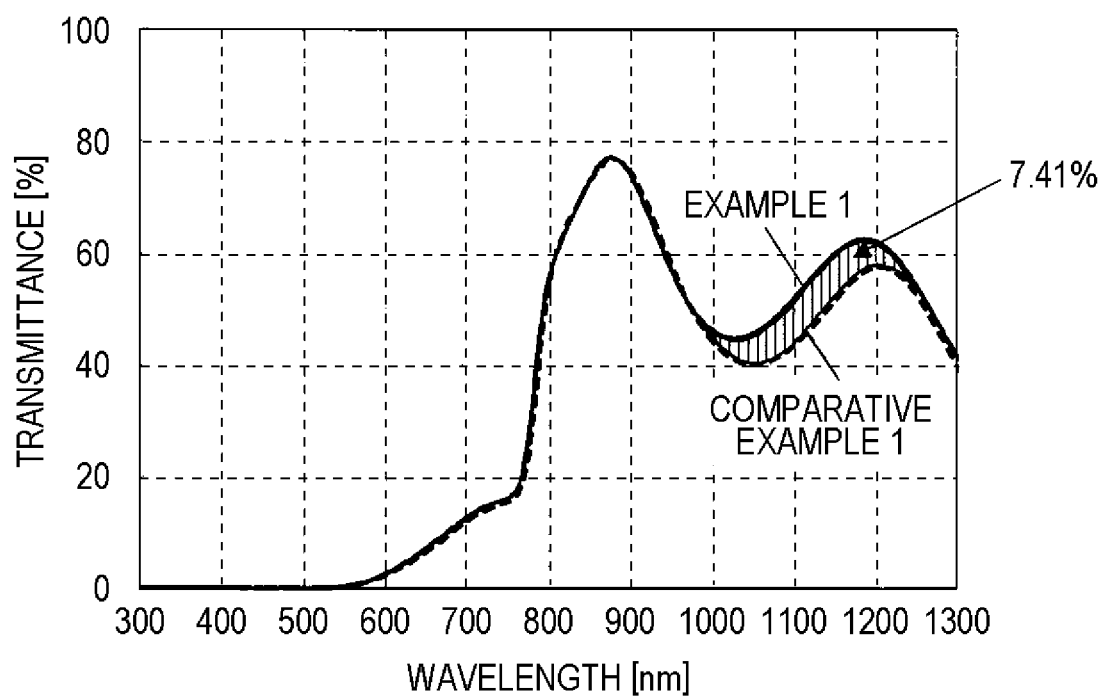
FIG. 8 is a graph illustrating a transmission spectrum of a top cell in a solar cell of Example 1 or Comparative example 1.

FIG. 8 is a graph illustrating a transmission spectrum of the top cell in the solar cell of 1 or Comparative example 1. Specifically, the horizontal axis in FIG. 8 represents the wavelength, and the vertical axis represents the transmittance. As illustrated in FIG. 8, it can be ascertained that the solar cell of Example 1 has higher transmittance than Comparative example 1 in the wavelength range of 900 nm to 1,300 nm. The transmittance in the wavelength region of 900 nm to 1,300 nm illustrated in FIG. 8 was integrated, and the area was compared. It can be ascertained that a total amount of light incident on the bottom cell in the solar cell of Example 1 is about 7.4% greater than that of the solar cell of Comparative example 1.

TABLE 1

| | Photoelectric conversion efficiency (%) | Integral of transmittance in wavelength range of 900 nm to 1300 nm (% × nm) |
|---|---|---|
| Example 1 | 15.1 | 21787.9 |
| Comparative example 1 | 14.5 | 20288.2 |
| Comparative example 2 | 0.5 | — |

The solar cell according to the present disclosure is useful as various solar cells such as a solar cell to be disposed on a roof.

What is claimed is:
1. A solar cell comprising:
a first substrate;
a first hole transport layer;
a first photoelectric conversion layer; and
a second photoelectric conversion layer in this order,
wherein the first hole transport layer contains a p-type metal oxide semiconductor and a p-type organic semiconductor polymer,
the first photoelectric conversion layer contains a perovskite compound,
the second photoelectric conversion layer contains a photoelectric conversion material,
a band gap of the perovskite compound is greater than a band gap of the photoelectric conversion material,
with respect to an absorption wavelength of the first photoelectric conversion layer, a refractive index $n_A$ of the first hole transport layer satisfies Relational expression (1) below, refractive index of the first substrate≤$n_A$≤refractive index of the first photoelectric conversion layer,   Relational expression (1):

with respect to a transmission wavelength of the first photoelectric conversion layer and an absorption wavelength of the second photoelectric conversion layer, a refractive index $n_B$ of the first hole transport layer satisfies Relational expression (2) below, refractive index of the first substrate≤$n_B$≤refractive index of the first photoelectric conversion layer,   Relational expression (2):

the refractive index $n_A$ of the first hole transport layer with respect to the light with a wavelength of 500 nm is greater than or equal to 2.00 and less than or equal to 2.61, and the refractive index $n_B$ of the first hole transport layer with respect to the light with a wavelength of 1,000 nm is greater than or equal to 1.75 and less than or equal to 2.17.

2. The solar cell according to claim 1,
wherein the p-type metal oxide semiconductor is
at least one selected from the group consisting of nickel oxide, copper(I) oxide, and copper(II) oxide.

3. The solar cell according to claim 1,
wherein the p-type organic semiconductor polymer is at least one selected from the group consisting of a phenyl amine containing a tertiary amine in the skeleton, a triphenylamine derivative, and a poly(3,4-ethylenedioxythiophene) compound having a thiophene structure.

4. The solar cell according to claim 3,
wherein the p-type organic semiconductor polymer is at least one selected from the group consisting of a poly(3,4-ethylenedioxythiophene) doped with a poly (4-styrenesulfonic acid), a poly[bis(4-phenyl)(2,4,6-triphenylmethyl)amine], and (2,2',7,7'-tetrakis(N,N-di-p-methoxyphenylamino)-9,9'-spirobifluorene).

5. The solar cell according to claim 1,
wherein the p-type metal oxide semiconductor is nickel oxide, and
the p-type organic semiconductor polymer is a poly(3,4-ethylenedioxythiophene) doped with a poly(4-styrenesulfonic acid).

6. The solar cell according to claim 5,
wherein a volume ratio of the p-type organic semiconductor polymer to a total of the p-type metal oxide semiconductor and the p-type organic semiconductor polymer is greater than or equal to 0.12 and less than or equal to 0.46.

7. The solar cell according to claim 1,
wherein Relational expression (1) above is satisfied with respect to light with a wavelength of 500 nm, and
Relational expression (2) above is satisfied with respect to light with a wavelength of 1,000 nm.

8. The solar cell according to claim 7, further comprising a first electrode layer disposed between the first substrate and the first hole transport layer,
wherein the refractive index $n_A$ of the first hole transport layer with respect to the light with a wavelength of 500 nm satisfies Relational expression (3) below, refractive index of the first electrode layer $\leq n_A \leq$ refractive index of the first photoelectric conversion layer, and     Relational expression (3):

the refractive index $n_B$ of the first hole transport layer with respect to the light with a wavelength of 1,000 nm satisfies Relational expression (4) below, refractive index of the first electrode layer $\leq n_B \leq$ refractive index of the first photoelectric conversion layer.     Relational expression (4):

9. The solar cell according to claim 1, further comprising a first electron transport layer,
wherein the first electron transport layer is disposed between the first photoelectric conversion layer and the second photoelectric conversion layer.

10. The solar cell according to claim 1, further comprising an intermediate layer,
wherein the intermediate layer is disposed between the second photoelectric conversion layer and the first photoelectric conversion layer.

11. The solar cell according to claim 10, further comprising
a second hole transport layer,
wherein the second hole transport layer is disposed between the intermediate layer and the second photoelectric conversion layer.

12. The solar cell according to claim 11, further comprising
a second electron transport layer,
wherein the second electron transport layer, the second photoelectric conversion layer, and the second hole transport layer are disposed in this order.

13. The solar cell according to claim 12, further comprising:
a first electrode layer; and
a second electrode layer,
wherein the first electrode layer is disposed between the first substrate and the first hole transport layer, and
the second electrode layer is disposed on a main surface opposite to a main surface of the second electron transport layer facing the second photoelectric conversion layer.

14. The solar cell according to claim 13, further comprising:
a third electrode layer; and
a fourth electrode layer,
wherein the third electrode layer is disposed between the intermediate layer and the first photoelectric conversion layer, and
the fourth electrode layer is disposed between the intermediate layer and the second hole transport layer.

15. The solar cell according to claim 14, further comprising
a second substrate,
wherein the second substrate is disposed between the intermediate layer and the fourth electrode layer.

16. The solar cell according to claim 14,
wherein the intermediate layer is a bonding layer for bonding the third electrode layer to the fourth electrode layer.

17. The solar cell according to claim 10,
wherein the intermediate layer is a recombination layer for recombining an electron and a hole.

18. The solar cell according to claim 1,
wherein the photoelectric conversion material is composed of silicon.

\* \* \* \* \*